United States Patent [19]

Davis et al.

[11] Patent Number: 4,595,972
[45] Date of Patent: Jun. 17, 1986

[54] ON/OFF POWER DETECTOR

[75] Inventors: Walter L. Davis, Coral Springs; Michael J. DeLuca, Boca Raton, both of Fla.

[73] Assignee: Motorola, Inc., Schaumburg, Ill.

[21] Appl. No.: 683,098

[22] Filed: Dec. 18, 1984

[51] Int. Cl.$^4$ .......................... H02M 3/00; H04B 1/16
[52] U.S. Cl. ...................... 363/15; 340/652; 455/343
[58] Field of Search .............. 323/285, 299, 351, 279; 363/15, 50; 361/54, 56, 88; 455/343; 340/636, 644, 652; 307/530

[56] References Cited

U.S. PATENT DOCUMENTS

| 3,590,370 | 6/1971 | Fleischer | 340/652 X |
|---|---|---|---|
| 3,996,479 | 12/1976 | Schmitz | 328/147 X |
| 4,142,118 | 2/1979 | Guritz | 307/358 |
| 4,177,394 | 12/1979 | Takasugi | 307/357 |
| 4,316,105 | 2/1982 | Fowler | 307/362 |
| 4,422,178 | 12/1983 | Mori | 455/343 |
| 4,473,759 | 9/1984 | Mahabadi | 307/350 |
| 4,513,446 | 4/1985 | Leslie | 455/343 X |

Primary Examiner—Peter S. Wong
Attorney, Agent, or Firm—Daniel K. Nichols; Joseph T. Downey; Edward M. Roney

[57] ABSTRACT

This on/off power detector includes an input connected directly to a power source and input connected to the power source through a switch. The detector compares voltages on the two inputs to produce an output signal when the voltage on the switched input drops a predetermined amount below the voltage on the unswitched input, which is indicative of the switch being open. The detector is strobed on and off and only compares the input voltages to provide the output signal when it is in its strobed on condition.

13 Claims, 3 Drawing Figures

ON/OFF POWER DETECTOR

BACKGROUND OF THE INVENTION

This invention relates to an on/off power detector in general and, in particular, to a circuit for indicating when a power switch has been opened to a low power dissipation device. In conventional high power type circuits, voltage present at the output side of a power switch tends to drop quickly when the switch is open due to the load connected to the switch.

However, when extremely low power circuitry, such as CMOS digital circuitry, is being powered from a circuit having capacitive elements a problem exists in determining when a switch has been turned off. Power stored in such capacitive elements can power circuits for a relatively long time period before the voltage is substantially reduced.

Determining when a power switch has been opened becomes particularly significant in some applications, such as portable paging equipment, where it is desirable that the circuit perform certain functions whenever a power switch is closed to turn on the unit. Such functions can include providing an audio alert to indicate the presence of sufficient battery voltage to operate the unit as well as to assure that the digital decoding circuitry and/or microprocessor are reset so that any required initial power up logic functions can occur. Where a switch is turned off for only a short period of time and then turned back on, any reset which depends on the device detecting a low voltage at the output of the switch will not operate properly if the switched voltage has not fallen to a sufficiently low level.

Some portable paging receivers utilize a single cell battery and a DC to DC converter to provide stepped up DC operating voltages for powering various circuits. In these devices, the DC to DC converter includes a substantial output capacitor which can provide sufficient output voltage to power a low power circuit for a substantial time, making it impossible to determine the state of the power switch from the voltage level appearing at the output of the converter.

One approach to determining when a switch has been opened is to directly measure the voltage at the output of the power switch, however, this approach offers some serious limitations in the case of battery powered equipment. Because a battery supply can have a normal operating voltage varying over a substantial range and still power the device, a trigger point for such a voltage detector would have to be below the normal battery voltage operating range. Consequently, such a circuit would not detect the opening of a power switch until such time as the voltage has dropped from a substantially higher battery voltage to a trigger point below the lower battery voltage operating range.

SUMMARY OF THE INVENTION

This invention is an ON/OFF power detector that can be used in situations in which a load is connected through an ON/OFF power switch to a voltage source, to provide an output signal when the switch is opened, and which operates independently of the absolute value of the power source voltage.

In one aspect of the invention, the power detector includes a first input means which is operatively connected directly to the voltage source and a second input means which is operatively connected to the switched output. Comparator means are responsive to voltages on the first and second input means for providing an output signal when the voltage difference between the first and second inputs exceed a predetermined amount.

In another aspect of the invention, the comparator means includes a control input and is responsive to a signal on the control input for providing the output signal. A strobe means is connected to the control input for providing the control input signal. In yet another aspect of the invention, the comparator means is actuated on and draws current when said control input signal is present and is off and does not draw current when said control input signal is not present unless an open switch has been detected. In still another aspect of the invention, a timer means is connected to the comparator means and provides an output signal that is responsive to the comparator means output signal but in a timed delayed relation.

In still another aspect of the invention, timer means includes a current source with a capacitor means connected to the current source. A first switching means shunts the capacitor means and is responsive to the comparator means output signal for shunting current from the capacitor means in the absence of said output signal. A second switching means is responsive to voltage on the capacitor means for providing said timing means output signal.

DESCRIPTION OF THE PREFERRED EMBODIMENT

Figure 1:
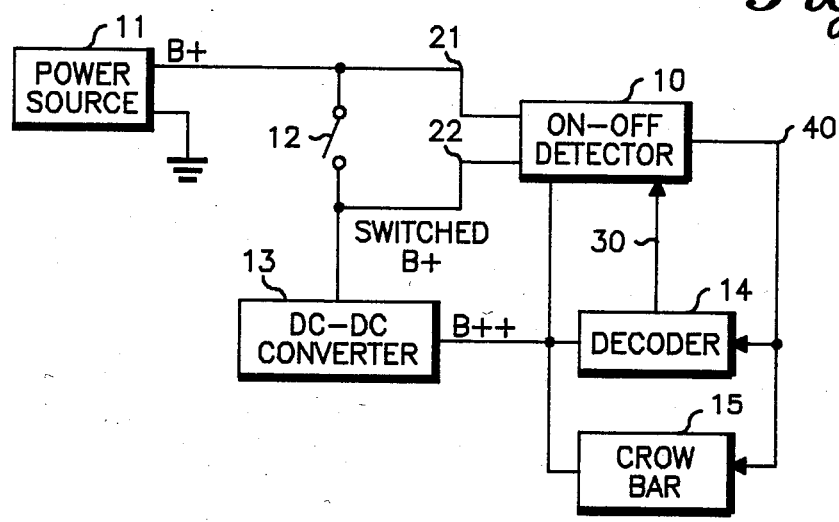
FIG. 1 is a block diagram of a pager decoder circuit utilizing an on/off power detector.

Referring now by characters of reference to the drawings and first to FIG. 1, a circuit is disclosed in which an on/off detector 10 can be utilized. A power source 11 is shown for supplying power through a switch 12 to a DC-DC converter 13 that is utilized to provide a higher output voltage to power a load such as a decoder 14.

It is desirable to provide a crow bar circuit 15, which is also connected to the output of the DC-DC converter 13. The crow bar circuit 15 is selectively actuated to discharge an output capacitor of the DC-DC converter. For additional information on this crow bar circuit, reference may be made application Ser. No. 657,637 filed Oct. 4, 1984, in the name of Walter Lee Davis, et al. entitled A POWER SUPPLY CIRCUIT and assigned to the assignee of the present application, which is hereby incorporated by reference.

The ON/OFF detector 10 is utilized to provide an output signal on its output 40 for indicating when the switch 12 has been opened. This output 40 is used to actuate the crow bar circuit 15 as well as to provide a reset signal to the decoder 14.

As will be discussed in detail, a strobe signal is provided on the line 30 from the decoder 14 in order to actuate or enable the ON/OFF detector 10. It will be further understood that the decoder 14 can be utilized in conjunction with a device such as a paging receiver in which an RF signal is decoded in order to recognize a coded signal indicating a message for a particular receiver which would incorporate the various components of FIG. 1. Such a decoder 14 can be constructed as a specific purpose digital circuit or, as is well known in the art, provided by microprocessor based circuitry.

The ON/OFF detector 10 provides the necessary signal to the decoder 14 that the switch 12 has been opened and serves to reset the decoder circuitry and any other circuitry associated with the device such as the crowbar 15. Additional information on decoder 14 and on DC-DC converter 13 and their incorporation into a paging receiver is included in U.S. Pat. No. 4,355,277 issued Oct. 19, 1982 to Walter L. Davis, et al. entitled Dual Mode DC/DC Converter, which is hereby incorporated by reference.

Figure 2:
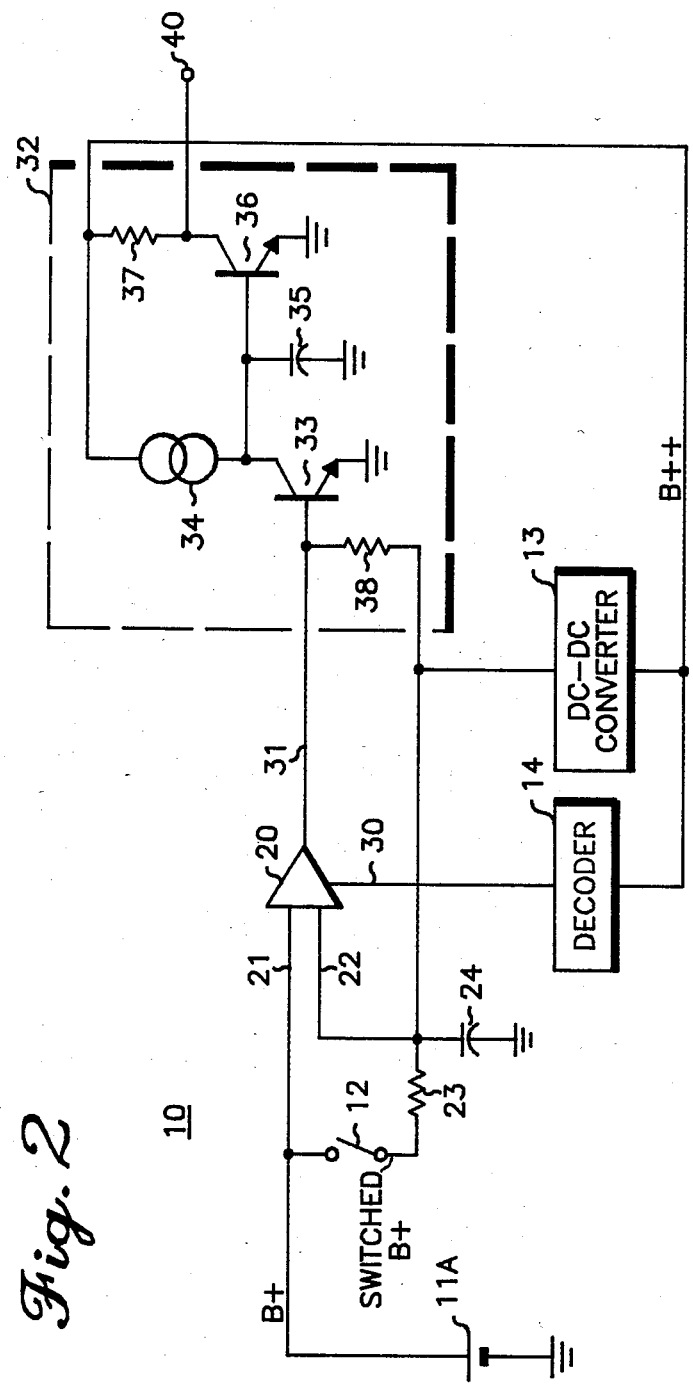
FIG. 2 is an electrical schematic diagram of an embodiment of the on/off power detector.

Referring now to FIG. 2, it will be understood that the ON/OFF detector indicated generally by 10 includes a comparator 20 constituting comparator means and a delay circuit 32 constituting timer means. A single cell battery 11A constitutes a power source and provides B+ voltage. A switch 12 constituting switching means is connected to the battery 11A with its output providing a switched B+ voltage to the circuit elements.

The comparator 20 has a first input 21 which is operatively connected directly to battery 11A, (the unswitched B+ voltage). A second input 22 of the comparator 20 is operatively connected to the output of a power switch 12 (the switched B+ voltage). In the preferred embodiment, the input 22 is connected to the switch 12 through a decoupling resistor 23 having a relatively low value of resistance. A decoupling capacitor 24 is also connected to the output of the switch 12 through the decoupling resistor 23.

A DC-DC converter 13 is powered by the switched B+ from the switch 12 for providing a stepped up B++ output voltage. A load, such as decoder 14 constituting a decoder means, is connected to the B++ output of DC-DC converter 13. The comparator 20 includes an enable or control input 30 which is connected to the decoder 14. The decoder 14 includes strobe means capable of providing an enable signal to the comparator 20 on the control input 30.

The comparator 20 has an output 31 connected to a delay circuit 32. The delay circuit 32 includes a first NPN switching transistor 33 constituting first switching means having its base connected to the comparator output 31 and its emitter connected to ground. A bias resistor 38 connects the base of transistor 33 to switched B+. A current source 34 is connected between a voltage source such as to the B++ output of DC-DC converter 13, to the collector of transistor 33, and to the base of NPN switching transistor 36. Also connected to the collector of transistor 33 is a capacitor 35, constituting capacitive means, which has its other side connected to ground. Transistor 36 has its emitter connected to ground and its collector connected by a biasing resistor 37 to a voltage source such as to the B++ output of DC-DC converter 13. The collector of transistor 36 is connected to the detector output 40.

Figure 3:
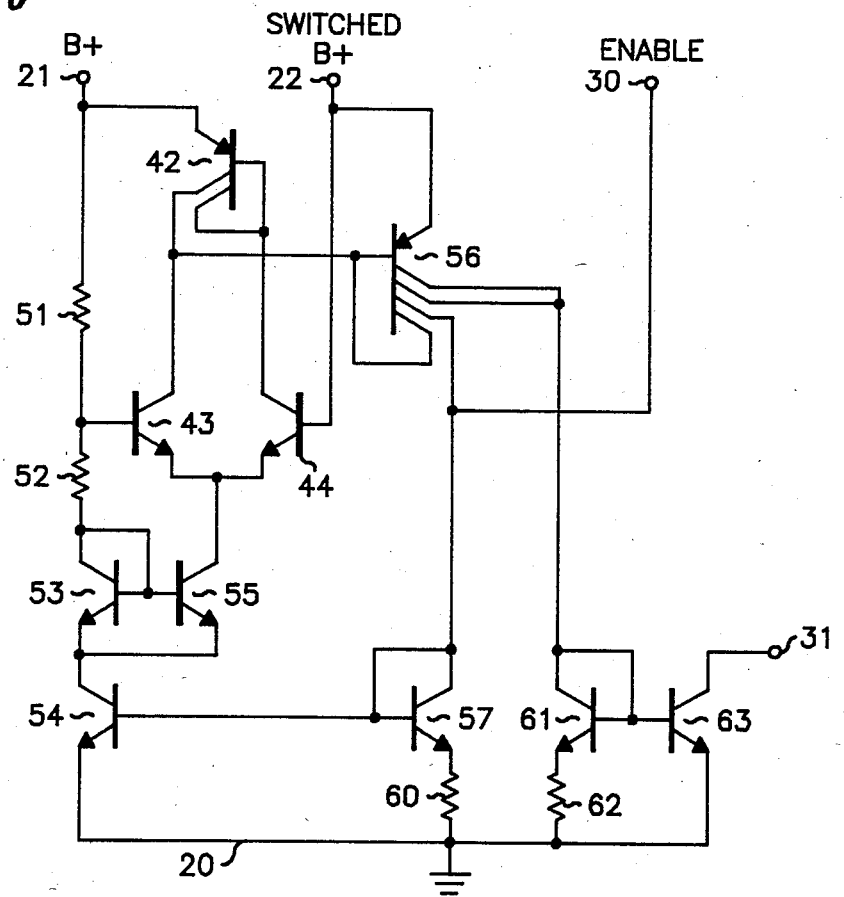
FIG. 3 is an electrical schematic diagram of an embodiment of the comparator means of the on/off power detector.

It will be understood that the comparator 20 in the preferred embodiment, as illustrated in FIG. 3, can be implemented in integrated circuit fashion on a single chip thereby providing closely matched transistors and allowing for production of multiple collector transistors having precisely defined collector current ratios. It will be seen that the inputs 21 and 22 provide both the input voltages for comparison as well as the operating voltage for the comparator.

A first PNP transistor 42 has its emitter coupled to the B+ power supply at input 21 and a pair of equal collectors with one collector connected to the collector of a NPN transistor 43 and the other collector connected to the collector of an NPN transistor 44. The base of transistor 42 is also connected to the collector of transistor 44.

The base of transistor 43 is connected to the B+ voltage of battery 11A by a voltage divider network comprised of a first resistor 51 connected to input 21 and the base of transistor 43 and a second resistor 52 which is connected to the base of transistor 43 and having its other end operatively connected to ground. Connecting resistor 52 to ground is a NPN transistor 53, connected as a diode, having its collector and base connected to resistor 52 and its emitter connected to the collector of an NPN switching transistor 54. An NPN transistor 55 has its base connected to base of transistor 53 and its emitter connected to the emitter of transistor 53. The collector of transistor 53 is connected to the emitters of transistors 43 and 44.

A PNP transistor 56 has an emitter connected to switched B+ 22 and its base connected to the collector of transistor 43. Transistor 56 includes four collectors providing substantially equal current flow in each. One of the collectors is connected to the base of transistor 56. The control input 30 is connected to a second collector of transistor 56 and to the collector and base of an NPN transistor 57. The transistor 57 has its emitter connected by resistor 60 to ground. The remaining two collectors of transistor 56 are connected together and connected to the collector and base of an NPN transistor 61 which has its emitter connected to ground by a resistor 62. Also connected to the base of transistor 61 is the base of NPN transistor 63. Transistor 63 has its emitter connected to ground and its collector provides the output connection 31 of comparator 20.

In the operation of comparator 20, a current source control signal on line 30 applies current to diode connected transistor 57 and turns on transistor 54 which grounds the emitters of transistors 53 and 55 which are connected in current mirror fashion. Current from B+ flows through resistors 51 and 52 turning on transistors 53 and 55. The current in transistor 53 which is connected as a diode will be equal to the current in transistor 55. With transistor 55 turned on, a differential amplifier comprised of transistors 42, 43 and 44 is turned on.

In the differential amplifier, transistor 42 acts as a current mirror with equal collector currents, and serves to generate a net current flow out of the base of PNP transistor 56 that is equal to the collector current of transistor 43 minus the collector current of transistor 44. Thus, due to the differential action of transistors 43 and 44 which are constrained to have a combined collector current equal to the current provided by current source transistor 55, there is a net current flow out of the base of 56 whenever the voltage at the base of transistor 43 is greater than the voltage at the base of transistor 44. Otherwise, the base of transistor 56 is pulled to B+ by the output of the collector of transistor 42 which constitutes a mirror device. Thus, transistor 56 is held OFF whenever the voltage at the base of 44 is above the voltage at the base of 43, and is turned ON whenever the voltage at the base of 44 drops below the voltage on the base of 43.

Transistor 61 and 63 are connected as a step-up current mirror to the two collectors of transistor 56, and the collector of 63 is connected to the output 31 of the comparator.

Thus, if the base voltage of transistor 43 is less than the base voltage of transistor 44—indicative that the power switch is closed—when the enable strobe signal is applied, transistor 56 is held off, transistors 61 and 63 are consequently OFF, and the output 31 is pulled by resistor 38 to the base emitter voltage level of transistor 33.

If the base voltage of transisor 43 is above the base voltage of transistor 44 indicative that the power switch is open when the enable signal is applied, transistor 56 is biased ON by the differential amplifier. Transistor 61 and 63 are consequently biased ON, and transistor 63 is saturated with the collector pulled to ground. In addition, once transistor 56 has been turned ON, the connection of its collector to transistors 57 and 54 locks the comparator 20 in an on condition even upon termination of the strobe signal on input 30.

It will be appreciated that the comparator can only provide an output signal if a condition is detected in which the voltage on the base of transistor 43 is greater than the voltage on the base of transistor 44 and a signal is present on line 30 to actuate the circuitry.

Referring now to FIG. 2, as long as transistor 63 is off, resistor 38 will bias transistor 33 on thereby shunting current source 34 to ground and keeping the voltage on capacitor 35 low. When transistor 63 turns on, indicative of switch 12 being opened, the base of transistor 33 is grounded thereby turning it off. Current from current source 34 will start charging capacitor 35 and a short time interval later sufficient voltage will be present at the base of transistor 36 to turn it on and pull output 40 low thereby indicating that switch 12 has been opened.

The time delay in turning on transistor 36 prevents an instantaneous off indication which could result in false off signals being generated under transient conditions, such as could occur if switch 12 was to bounce open under an impact force.

An important power savings feature is accomplished by use of the control input 30, in that the comparator 20 is only actuated in the presence of the strobe signal. The strobe signal corresponds to the operating cycle of decoder 14.

It is thought that the structural features and advantages of the ON/OFF detector 10 have been fully disclosed in the foregoing description of parts but for completeness of disclosure the utilization of the circuitry will be briefly discussed.

Referring to FIG. 3, the values of resistors 51 and 52 are chosen so that under normal operating conditions with switch 12 closed the voltage on the base at transistor will be equal to or slightly less than the voltage on the base of transistor 44. In a preferred embodiment, a strobe signal of 8 milliseconds duration is applied to the control input 30 every 150 milliseconds. During each 8 millisecond strobe signal period the comparator 20 is turned on to make a voltage comparasion. A substantial battery power savings is accomplished in the comparator 20 by use of this low duty cycle of operation.

When the switch 12 is opened and the next strobe signal is received, the comparator 20 will detect the fact that the voltage on the base of transistor 44 is less than that on the base of transistor 43. Transistor 56 will turn on, latching on the comparator 20 and turning on transistor 63. This will in turn actuate delay circuit 32. The delay circuit 32 of the preferred embodiment introduces approximately a 60 to 70 millisecond delay before its output 40 is pulled to ground, to signal the opening of the switch 12 and reset the decoder 14 and actuate the crowbar 15.

It will be appreciated that when the switched B+ voltage has substantially dropped the comparator 20 will no longer be latched on since the operating voltage for transistor 56 is derived from the switched B+ output of switch 12. Transistor 63 will turn off, however, the signal at output 40 will be maintained due to the fact that transistor 33 derives its base bias from the B++ output of DC-DC converter 13 and will not be biased on. Consequently, as long as an operating voltage is still applied to current source 34 and the collector of transistor 36, transistor 36 will remain on. The delay circuit 32 will remain on until the B++ voltage has dropped as, for example, when the crow bar 15 is actuated to shunt B++ to ground.

We claim as our invention:

1. An on/off power detector for a circuit having a voltage source and a switch connected to the voltage source providing a switched output, comprising:
   a first input means operatively connected directly to the voltage source,
   a second input means operatively connected to the switched output and,
   comparator means responsive to voltages on the first and second input means for providing an output signal when the difference between the voltages on the first and second input means exceeds a predetermined amount,
   the comparator means including a control input means and is responsive to an enable signal on said control input means for providing said output signal.

2. An on/off power detector as defined in claim 1 in which:
   a strobe means is connected to the control input for providing said enable signal.

3. An on/off power detector as defined in claim 2 in which:
   the comparator means includes latching means for latching said comparator on and maintaining said output signal upon cessation of said enable signal.

4. An on/off power detector as defined in claim 3, in which:
   the comparator means is actuated on and draws current when said enable signal is present and when it is latched on and is off and does not draw current when said enable signal is not present and when it is not latched on.

5. An on/off power detector as defined in claim 1, in which:
   a timer means is connected to the comparator means and has an output means, the timer means providing an output signal in time delay response to the comparator means output signal.

6. An on/off power detector as defined in claim 5, in which:
   the timer means includes;
   a current source means, a capacitor means connected to the current source means,
   a first switching means shunting the capacitor means and responsive the comparator means output signal for selectively shunting current from the capacitor means in the absence of said output signal from the comparator means, and
   a second switching means responsive to voltage on the capacitor means for providing said timing means output signal.

7. An on/off power detector as defined in claim 6, in which:
the first switch means is operatively biased on to shunt current from the capacitor means when said switched output exceeds a predetermined amount.

8. An on/off power detector as defined in claim 7, in which:
the first switch means comprises a switching transistor which derives its base bias from the switched output voltage.

9. A low power, low voltage device comprising:
a low voltage power source,
a switching means connected to the power source,
a DC-DC converter, connected to the switching means,
a load powered by the DC-DC converter having a reset input, and
an on/off detector means having a first input connected to the power source, a second input connected to the output of the switching means and an output connected to the load reset input, the detector being responsive to the difference between voltages on the first and second inputs for providing a reset signal to reset signal to reset the load when the switching means is opened,
the on/off detector means including a control input means and is responsive to an enable signal on said control input means for providing said reset signal.

10. A low power voltage device as defined in claim 9 including a crow bar circuit connected to the dc-dc converter, the crow bar circuit being responsive to said reset signal.

11. A low-power low voltage device comprising
a low voltage power source,
a switching means connected to the power source,
a DC-DC converter, connected to the switching means,
a load powered by the DC-DC converter having a reset input, and
an on/off detector means having a first input connected to the power source, a second input connected to the output of the switching means and an output connected to the load reset input, the detector being responsive to the difference between voltages on the first and second inputs for providing a reset signal to reset the load when the switching means is opened,
the load constituting a decoder for a paging receiver and the decoder is connected to the on-off detector for supplying an enable signal to actuate the detector.

12. A portable paging receiver comprising,
a power source means having a switched output and an unswitched output,
a dc-dc converter powered from the switched output,
decoder means powered by the dc-dc converter, the decoder means including means producing a strobe signal, and having a reset input,
on-off power detector means coupled to and responsive to the switched and unswitched outputs for selectively providing a reset signal to said reset input, the detector means being responsive to said strobe signal to provide the reset signal when the dc-dc converter is switched off.

13. A portable paging receiver as defined in claim 12, in which:
a crow bar means is connected to the dc-dc converter and is responsive to said reset signal.

* * * * *